US012740236B2

(12) United States Patent
Saitoh et al.

(10) Patent No.: US 12,740,236 B2
(45) Date of Patent: Sep. 15, 2026

(54) DISPLAY DEVICE

(71) Applicant: SHARP KABUSHIKI KAISHA, Sakai City (JP)

(72) Inventors: Takao Saitoh, Sakai City (JP); Yohsuke Kanzaki, Sakai City (JP); Masaki Yamanaka, Sakai City (JP); Yi Sun, Sakai City (JP); Masahiko Miwa, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 639 days.

(21) Appl. No.: 18/027,368

(22) PCT Filed: Sep. 23, 2020

(86) PCT No.: PCT/JP2020/035808
§ 371 (c)(1),
(2) Date: Mar. 21, 2023

(87) PCT Pub. No.: WO2022/064562
PCT Pub. Date: Mar. 31, 2022

(65) Prior Publication Data

US 2023/0413615 A1 Dec. 21, 2023

(51) Int. Cl.
*H10K 59/121* (2023.01)
*H10K 59/123* (2023.01)
(Continued)

(52) U.S. Cl.
CPC ....... *H10K 59/121* (2023.02); *H10K 59/1213* (2023.02); *H10K 59/123* (2023.02);
(Continued)

(58) Field of Classification Search
CPC ............. H10K 59/121; H10K 59/1213; H10K 59/123; H10K 59/88; H10K 77/10;
(Continued)

(56) References Cited

U.S. PATENT DOCUMENTS 10,541,380 B1 * 1/2020 Sung .................... H10K 50/844
2018/0226617 A1 * 8/2018 Nakagawa ......... H10K 59/8731
(Continued)

FOREIGN PATENT DOCUMENTS

CN 103811530 A * 5/2014 ............. H10K 71/00
CN 110164916 A 8/2019
(Continued)

OTHER PUBLICATIONS

Translation for CN103811530A by Kim et al. (Year: 2014).*

*Primary Examiner* — Jacob Y Choi
*Assistant Examiner* — Ashley Nicole Blackwell
(74) *Attorney, Agent, or Firm* — ScienBiziP, P.C.

(57) ABSTRACT

According to an aspect pf the disclosure, a display device includes a base substrate; a thin film transistor layer provided on the base substrate and including a wiring layer; and a light-emitting element layer provided on the thin film transistor layer and including a plurality of first electrodes, a plurality of functional layers, and a common, second electrode, which are sequentially stacked in such a manner as to correspond to a plurality of subpixels in a display area.

18 Claims, 12 Drawing Sheets

(51) Int. Cl.
*H10K 59/88* (2023.01)
*H10K 77/10* (2023.01)
*H10K 59/131* (2023.01)
*H10K 59/80* (2023.01)

(52) U.S. Cl.
CPC ............. *H10K 59/88* (2023.02); *H10K 77/10* (2023.02); *H10K 59/131* (2023.02); *H10K 59/873* (2023.02); *H10K 59/8731* (2023.02)

(58) Field of Classification Search
CPC ............... H10K 59/131; H10K 59/873; H10K 59/8731; H10K 59/124; H05B 33/02; H05B 33/10; H05B 33/04; H05B 33/22
See application file for complete search history.

(56) References Cited

U.S. PATENT DOCUMENTS

2019/0051859 A1 2/2019 Choi et al.
2020/0067017 A1* 2/2020 Seo ........................ H10K 77/10
2021/0376290 A1* 12/2021 Zhang ................ H10D 30/6743
2021/0408511 A1 12/2021 Qin et al.
2023/0020238 A1 1/2023 Zhang et al.

FOREIGN PATENT DOCUMENTS

CN 110649177 A 1/2020
JP 2019035950 A 3/2019

* cited by examiner

50a
T
E
B
G
Wa
Wb
18i
18h
D
21a
H
60
N
VI
VII
VIII
III 20a
32c
22c
19b
Wb
10
32b
22b
Wa
38
37
36
40
8
7
6
18h
50a(F)
22a
20a
19a
17
15
13
11

50a
N
D
X
X
Wd
Wc
Ea
H

H
11
10
12c
34
6a
7a
8a
Ea
20b
34
13
15
17
Wd
32f 22f
Wc
32e 22e
36
37
38
40
19a
32d
20a
22a
50a(N)
30

50ba(N)
32d
40
38
37
36
Wc
32e
22e
Wd
32f
22f
20b
34
38
36
34
6b
7ba
8ba
Eba
10
11
13
15
17
19a
20a
22a
30

DISPLAY DEVICE

TECHNICAL FIELD

The disclosure relates to display devices.

BACKGROUND ART

The organic EL display device, which is a self-luminous display device built around organic electroluminescence (may be referred to as "EL" in the following) elements, has been attracting attention as an alternative to the liquid crystal display device The organic EL element includes, for example: an organic EL layer as a functional layer; a first electrode disposed on one of the surfaces of the organic EL layer; and a second electrode disposed on the other surface of the organic EL layer. To install, for example, electronic components such as a camera and/or a fingerprint sensor in a display area of this organic EL display device in which an image display is produced, a structure is being proposed that includes an insular non-display area having a through hole extending thickness-wise through the non-display area (see, for example, Patent Literature 1).

CITATION LIST

Patent Literature

Patent Literature 1: Japanese Unexamined Patent Application Publication, Tokukai, No. 2019-35950

SUMMARY

Technical Problem

The disclosure has an object to form a common functional layer at low cost by separately for a display area side and for a through hole side.

Solution to Problem

To achieve this object, a display device in accordance with the disclosure includes: a base substrate; a thin film transistor layer provided on the base substrate and including a wiring layer; and a light-emitting element layer provided on the thin film transistor layer and including a plurality of first electrodes, a plurality of functional layers, and a common, second electrode, which are sequentially stacked in such a manner as to correspond to a plurality of subpixels in a display area, wherein an insular non-display area is provided in the display area, a through hole extends in a direction of a thickness of the base substrate in the non-display area, a partition wall is provided in the non-display area so as to surround the through hole, and the partition wall is made of the same material, and provided in the same layer, as the wiring layer in such a manner that an edge of an upper side segment on a light-emitting element layer side on a through hole side projects toward the through hole side beyond an edge of a lower side segment, as opposed to the upper side segment, on a base substrate side on the through hole side.

Advantageous Effects of Disclosure

The disclosure is capable of forming a common functional layer at low cost by separately for a display area side and for a through hole side.

DESCRIPTION OF EMBODIMENTS

The following will describe embodiments of the disclosure with reference to drawings. The disclosure is not limited to the embodiments described below.

First Embodiment

Figure 1:
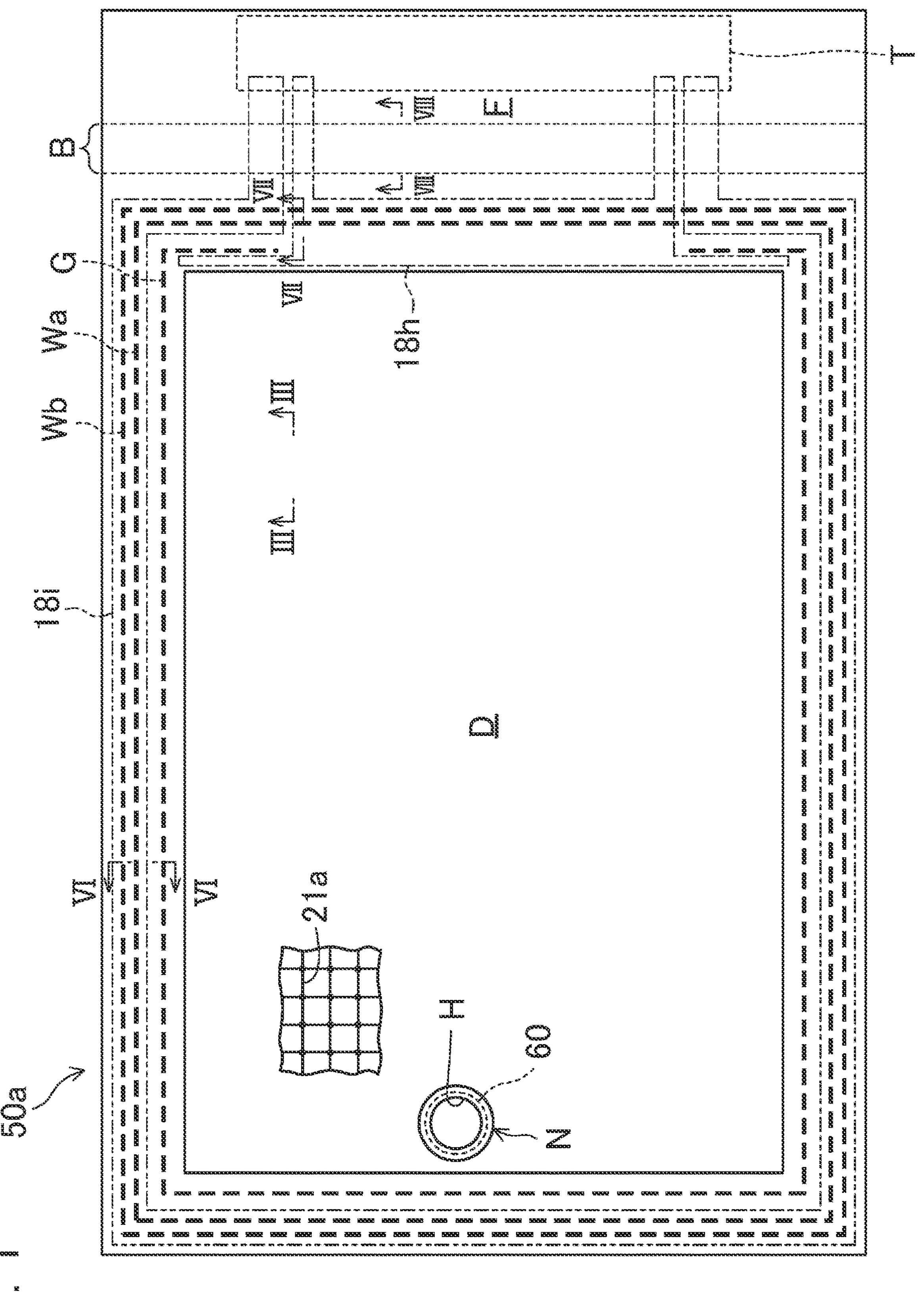
FIG. 1 is a schematic plan view of a structure of an organic EL display device in accordance with a first embodiment of the disclosure.
Figure 2:
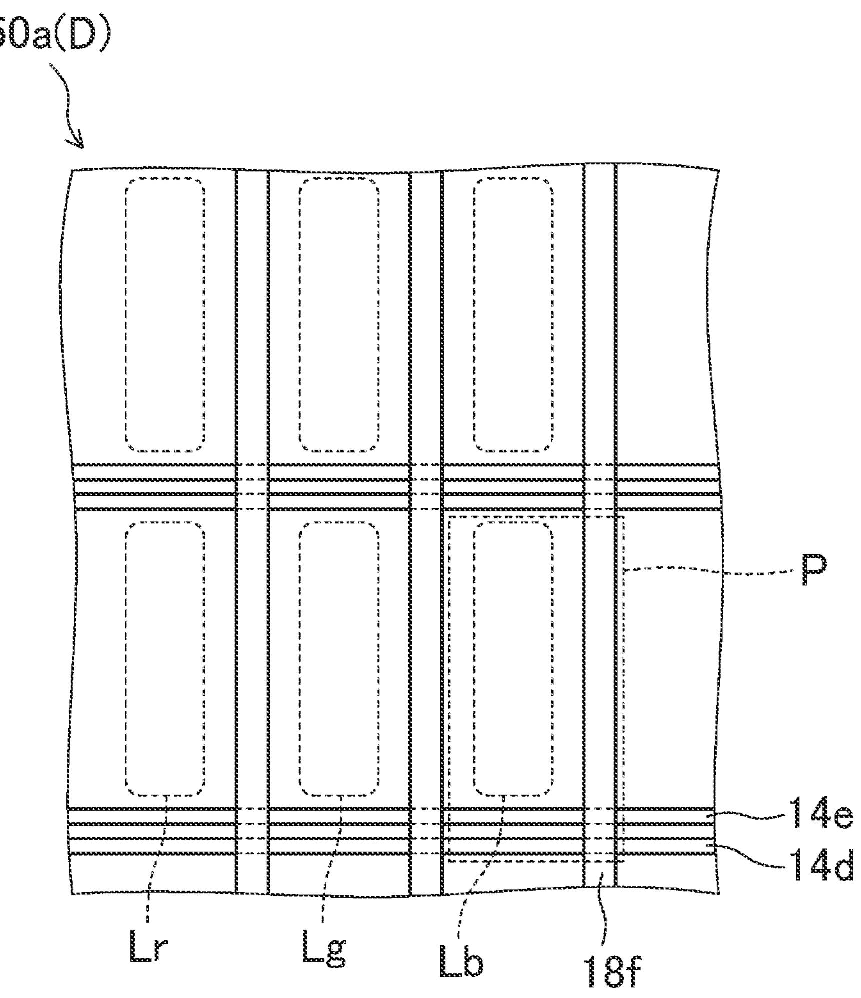
FIG. 2 is a plan view of a display area of the organic EL display device in accordance with the first embodiment of the disclosure.
Figure 3:
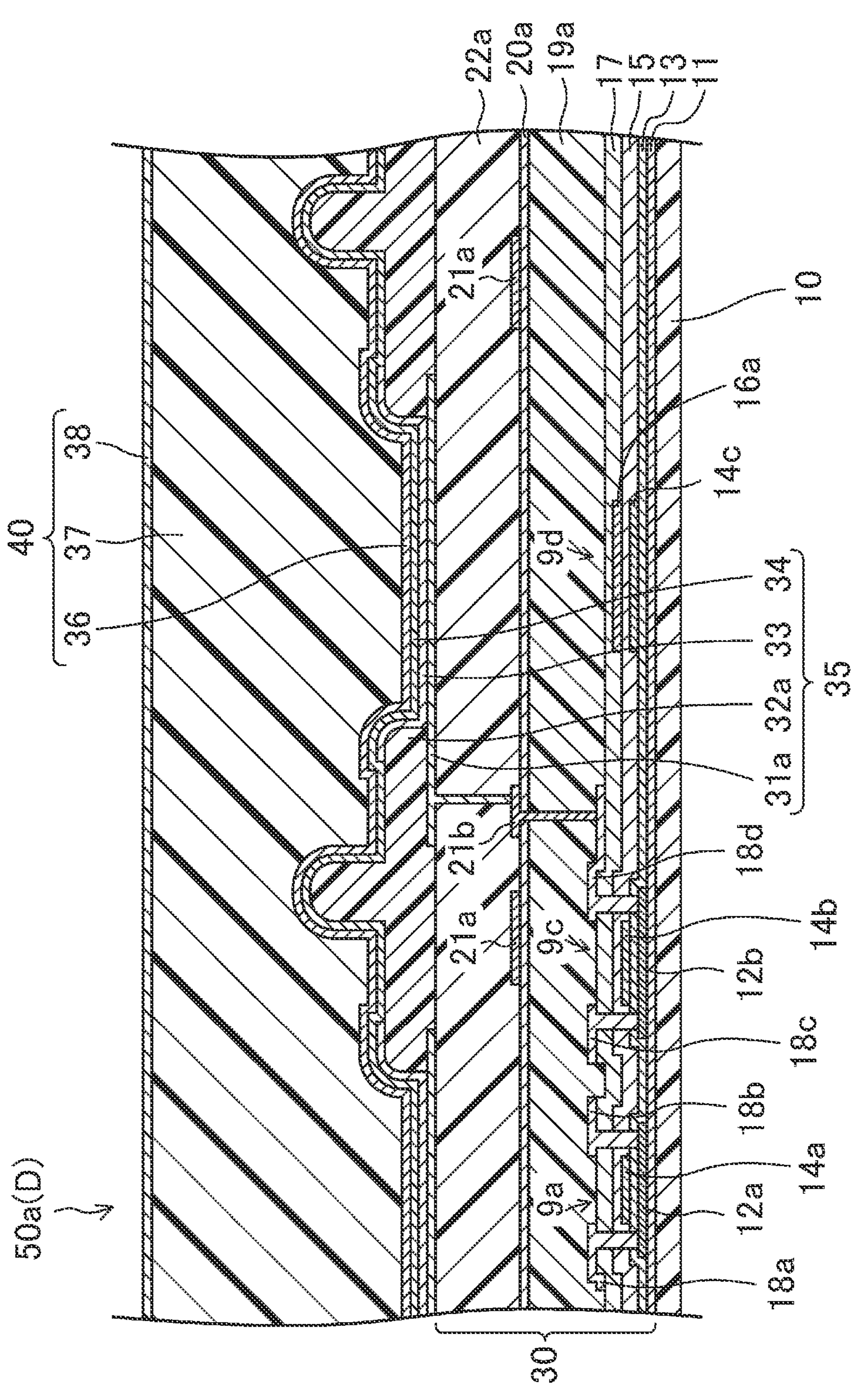
FIG. 3 is a cross-sectional view of the display area of the organic EL display device, taken along line III-III shown in FIG. 1.
Figure 4:
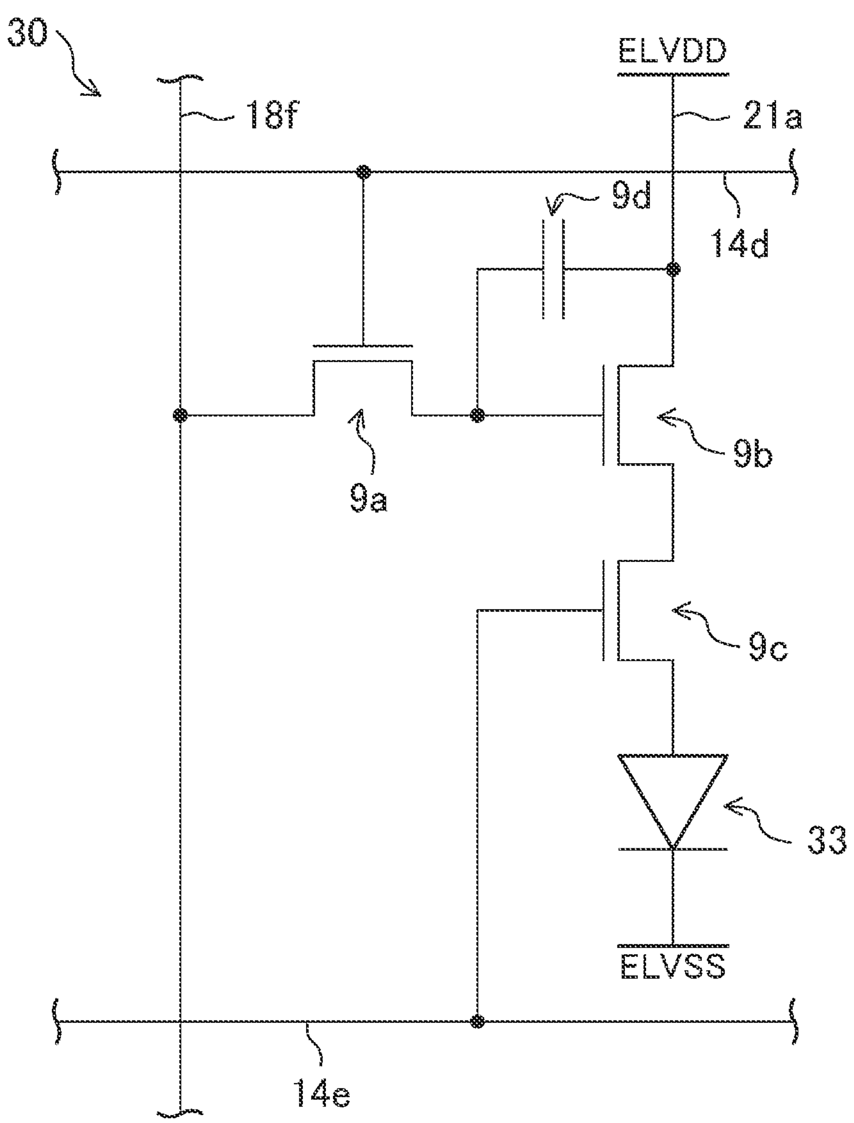
FIG. 4 is an equivalent circuit diagram of a thin film transistor layer in the organic EL display device in accordance with the first embodiment of the disclosure.
Figure 5:
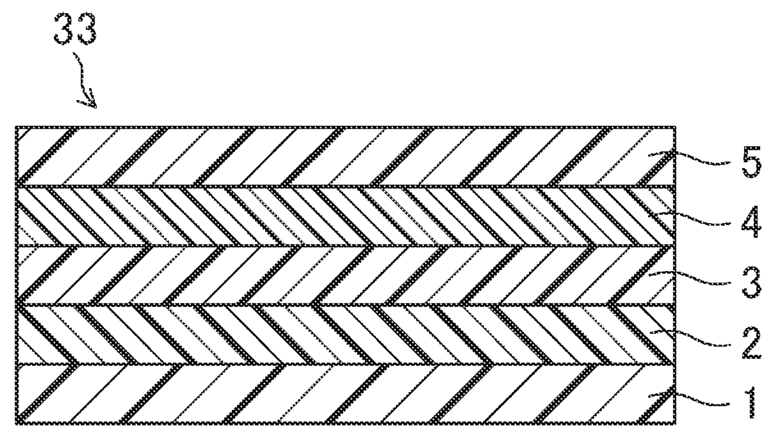
FIG. 5 is a cross-sectional view of an organic EL layer in the organic EL display device in accordance with the first embodiment of the disclosure.
Figure 6:
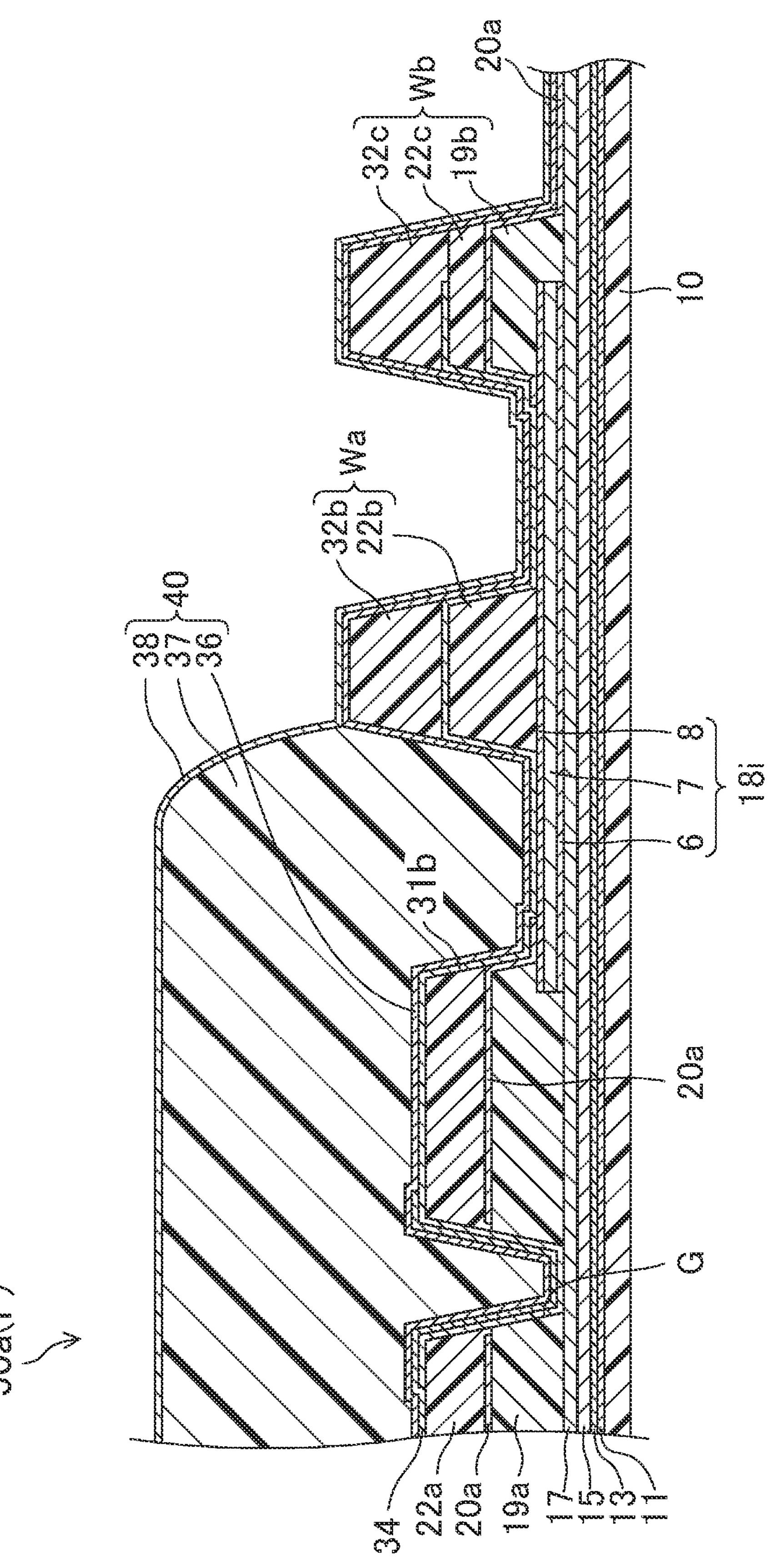
FIG. 6 is a cross-sectional view of a frame area of the organic EL display device, taken along line VI-VI shown in FIG. 1.
Figure 7:
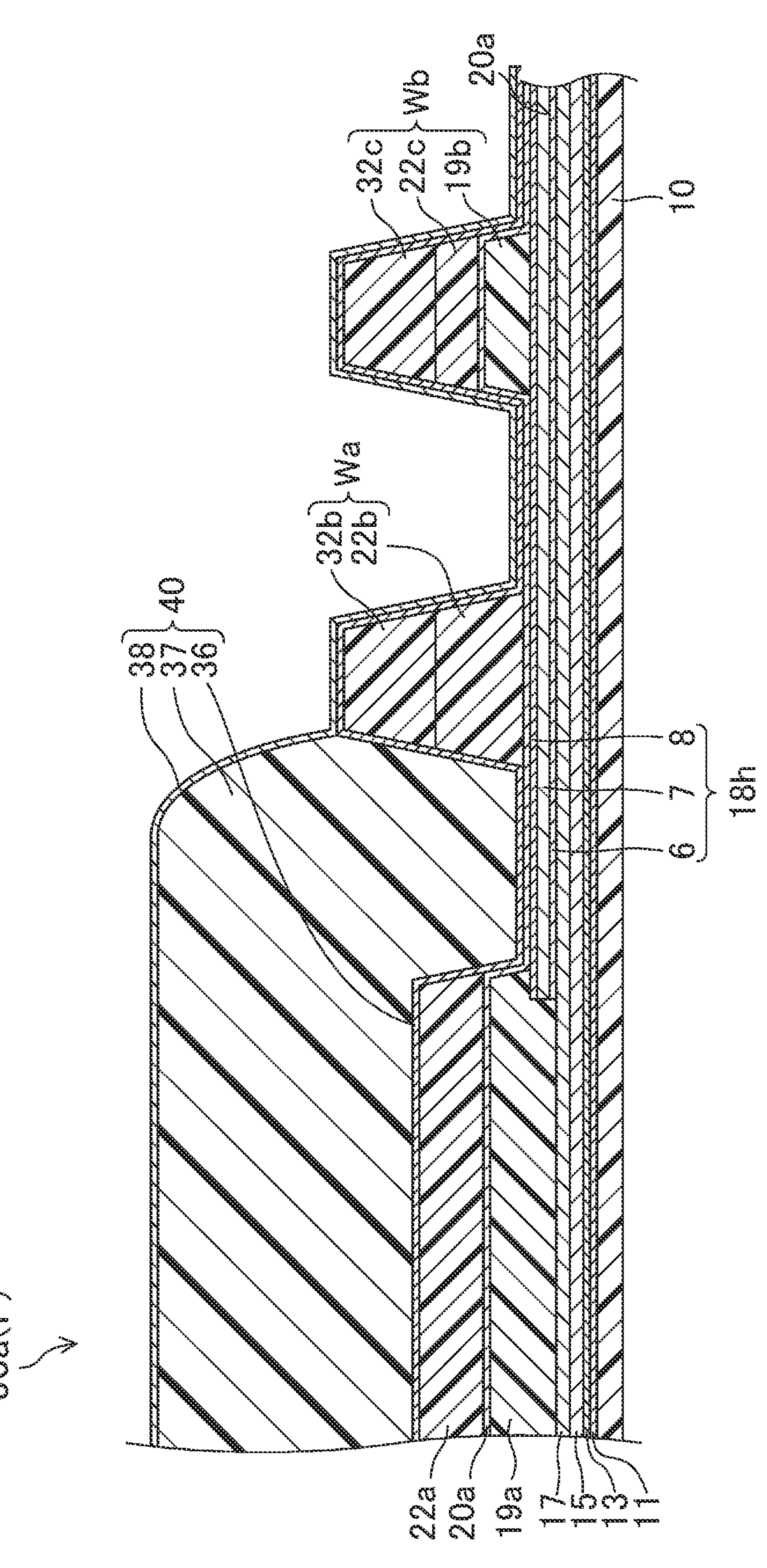
FIG. 7 is a cross-sectional view of the frame area of the organic EL display device, taken along line VII-VII shown in FIG. 1.
Figures 8, 9:
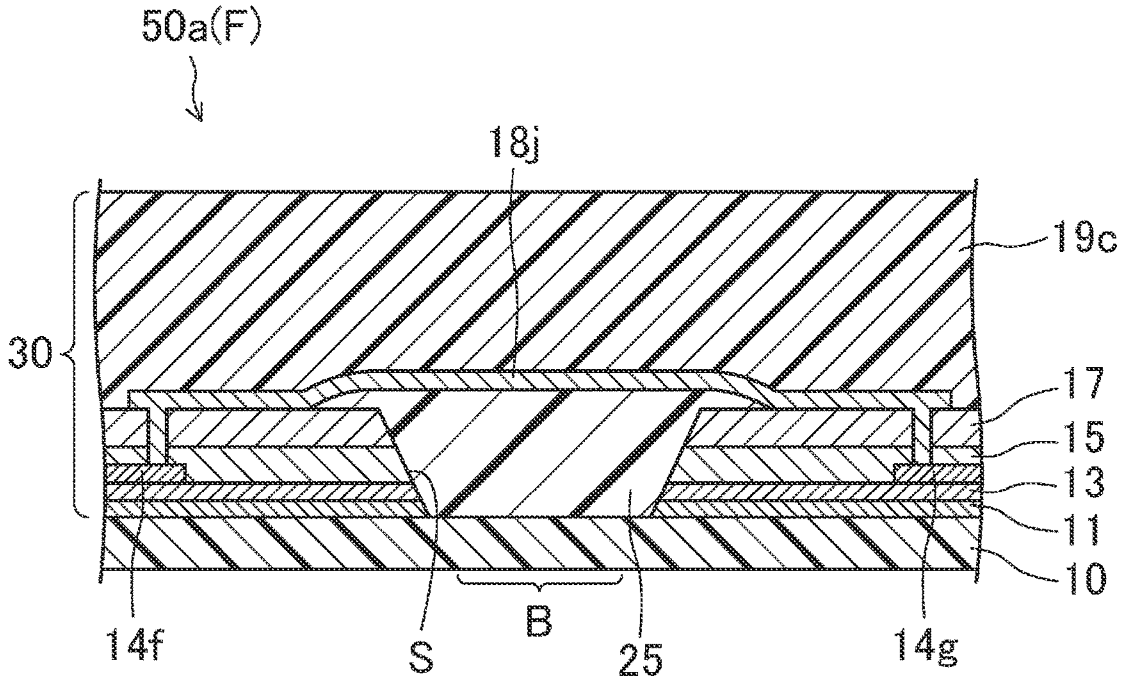
FIG. 8 is a cross-sectional view of the frame area of the organic EL display device, taken along line VIII-VIII shown in FIG. 1.
FIG. 9 is a plan view of a non-display area and its surrounding structure of the organic EL display device in accordance with the first embodiment of the disclosure.
Figure 10:
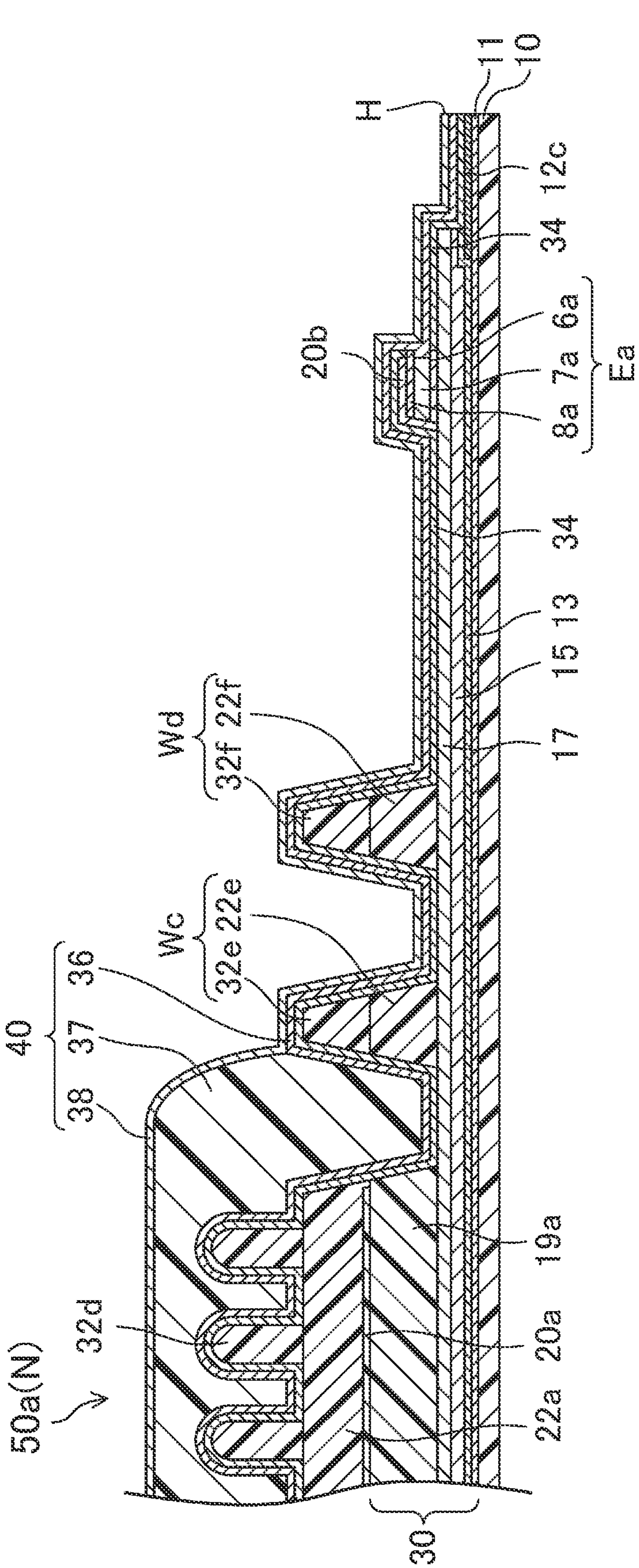
FIG. 10 is a cross-sectional view of non-display area of the organic EL display device, taken along line X-X shown in FIG. 9.

FIGS. 1 to 14 represent a first embodiment of the display device of the disclosure. The following embodiments will discuss an organic EL display device including an organic EL element layer an example of a display device including a light-emitting element layer. FIG. 1 is a schematic plan view of a structure of an organic EL display device 50*a* in accordance with the present embodiment. FIG. 2 is a plan view of a display area D of the organic EL display device 50*a*. FIG. 3 is a cross-sectional view of the display area D of the organic EL display device 50*a*, taken along line III-III shown in FIG. 1. FIG. 4 is an equivalent circuit diagram of a thin film transistor layer 30 in the organic EL display device 50*a*. FIG. 5 is a cross-sectional view of one of organic EL layers 33 in the organic EL display device 50*a*. FIGS. 6, 7, and 8 are cross-sectional views of a frame area F of the organic EL display device 50*a*, taken respectively along line VI-VI, line VII-VII, and line VIII-VIII all shown in FIG. 1. FIG. 9 is a plan view of a non-display area N and its surrounding structure of the organic EL display device 50*a*. FIG. 10 is a cross-sectional view of the non-display area N of the organic EL display device 50*a*, taken along line X-X shown in FIG. 9.

The organic EL display device 50*a*, as shown in FIG. 1, includes, for example: the rectangular display area D for image displays; and the frame area F shaped like a rectangular frame surrounding the display area D. Note that in the present embodiment, the rectangular display area D is described as an example where this “rectangular” shape encompasses, for example, generally rectangular shapes including those with a curved side(s), those with a round corner(s), and those with a notched side(s).

In the display area D, as shown in FIG. 2, there is provided a matrix of subpixels P. In the display area D are there also provided, for example, subpixels P each of which includes a red-light-emission region Lr for producing a red display, subpixels P each of which includes a green-light-emission region Lg for producing a green display, and subpixels P each of which includes a blue-light-emission region Lb for producing a blue display. Three subpixels, one from each of these three types of subpixels P, are arranged adjacent to each other as shown in FIG. 2. Note that in the display area D, a single pixel is composed of, as an example, three adjacent subpixels P that include one red-light-emission region Er, one green-light-emission region Eg, and one blue-light-emission region Eb. Additionally, the insular non-display area N is provided in the display area D as shown in FIG. 1. As shown in FIG. 1, there is provided a through hole H extending in the direction of the thickness of a resin substrate layer 10 (detailed later) through the non-display area N, to install, for example, electronic components 60 such as a camera and/or a fingerprint sensor. The structure and other specifics of the non-display area N will be detailed later with reference to FIGS. 9 and 10.

There is provided a terminal section T extending in one direction (vertical direction in the drawing) in the far right side of the frame area F in FIG. 1. In the frame area F, a bending portion B that is bendable, for example, by 180° (into a U-shape) about the vertical direction in the drawing as the bending axis is also provided between the display area D and the terminal section T so as to extend in one direction (vertical direction in the drawing), as shown in FIG. 1. The terminal section T includes a plurality of terminals extending in the direction in which the terminal section T extends. Also, in the frame area F, in a first planarization film 19*a* and a second planarization film 22*a* (both detailed later), there is provided a trench G, generally C-shaped in a plan view, that runs through the first planarization film 19*a* and the second planarization film 22*a*, as shown in FIGS. 1 and 6. The trench G is shaped generally like a letter C in such a manner that the trench G is open on the terminal section T side thereof in a plan view as shown in FIG. 1.

The organic EL display device 50*a*, as shown in FIG. 3, includes; the resin substrate layer 10 as a base substrate; the thin film transistor (hereinafter may be alternatively referred to as a TFT) layer 30 on the resin substrate layer 10; an organic EL element layer 35 as a light-emitting element layer on the TFT layer 30; and a sealing film 40 on the organic EL element layer 35.

The resin substrate layer 10 is made of, for example, an organic resin material such as a polyimide resin.

The TFT layer 30, as shown in FIG. 3, includes; a base coat film 11 on the resin substrate layer 10; and a plurality of first TFTs 9*a*, a plurality of second TFTs 9*b* (see FIG. 4), a plurality of third TFTs 9*c*, and a plurality of capacitors 9*d* on the base coat film 11. The TFT layer 30, as shown in FIG. 3, further includes the first planarization film 19*a*, a third interlayer insulating film 20*a*, and the second planarization film 22*a*, all of which are sequentially provided on each first TFT 9*a*, each second TFT 9*b*, each third TFT 9*c* and each capacitor 9*d*.

The TFT layer 30, as shown in FIG. 3, includes: semiconductor layers 12*a* and 12*b*; a gate insulating film 13; gate electrodes 14*a* and 14*b* and a lower conductive layer 14*c*; a first interlayer insulating film 15; an upper conductive layer 16*a*; a second interlayer insulating film 17; source electrodes 18*a* and 18*c* and drain electrodes 18*b* and 18*d*; the first planarization film 19*a*; the third interlayer insulating film 20*a*; power supply lines 21*a* and relay electrodes 21*b*; and the second planarization film 22*a*, all of which are sequentially stacked on the base coat film 11.

The TFT layer 30, in the display area D, includes, as a first wiring layer, a plurality of gate lines 14*d* extending parallel to each other in the horizontal direction in the drawing as shown in FIGS. 2 and 4. The TFT layer 30, in the display area D, further includes, as the first wiring layer, a plurality of light-emission control lines 14*e* extending parallel to each other in the horizontal direction in the drawing as shown in FIGS. 2 and 4. The gate lines 14*d* and the light-emission control lines 14*e* are made of the same material, and provided in the same layer, as the gate electrodes 14*a* and 14*b* and the lower conductive layer 14*c*. Additionally, each light-emission control line 14*e* is provided adjacent to each gate line 14*d* as shown in FIG. 2. The TFT layer 30, in the display area D, further includes, as a third wiring layer, a plurality of source lines 18*f* extending parallel to each other in the vertical direction in the drawing as shown in FIGS. 2 and 4. The source lines 18*f* are made of the same material, and provided in the same layer, as the source electrodes 18*a* and 18*c* and the drain electrodes 18*b* and 18*d*. The TFT layer 30, in the display area D, further includes the power supply lines 21*a* in a lattice form as a fourth wiring layer as shown in FIG. 1. In the TFT layer 30, each subpixel P includes one of the first TFTs 9*a*, one of the second TFTs 9*b*, one of the third TFTs 9*c*, and one of the capacitors 9*d* as shown in FIG. 4.

The base coat film 11, the gate insulating film 13, the first interlayer insulating film 15, and the second interlayer insulating film 17 are provided as second inorganic insulating films and made of, for example, a monolayer film of, for example, silicon nitride, silicon oxide, or silicon oxynitride or a stack of any of these monolayer films.

In each subpixel P, the first TFT 9*a* is electrically connected to an associated one of the gate lines 14*d*, an associated one of the source lines 18*f*, and an associated one of the second TFTs 9*b* as shown in FIG. 4. The first TFT 9*a* includes the semiconductor layer 12*a*, the gate insulating film 13, the gate electrode 14*a*, the first interlayer insulating film 15, the second interlayer insulating film 17, and the source electrode 18*a* and the drain electrode 18*b*, all of which are sequentially provided on the base coat film 11, as shown in FIG. 3. The semiconductor layer 12*a* is provided on the base coat film 11 as shown in FIG. 3 and has a channel region, a source region, and a drain region as will be described later. The semiconductor layer 12*a* and the semiconductor layer 12*b* (detailed later) are made of, for example, a low-temperature polysilicon film or an In—Ga—Zn—O-based oxide semiconductor film. The gate insulating film 13 is provided so as to cover the semiconductor layer 12*a* as shown in FIG. 3. The gate electrode 14*a* is provided on the gate insulating film 13 so as to overlap the channel region of the semiconductor layer 12*a* as shown in FIG. 3. The first interlayer insulating film 15 and the second interlayer insulating film 17 are sequentially provided so as to cover the gate electrode 14*a* as shown in FIG. 3. The source electrode 18*a* and the drain electrode 18*b* are provided on the second interlayer insulating film 17 so as to be separated by a distance from each other as shown in FIG. 3. The source electrode 18*a* and the drain electrode 18*b* are also electrically connected respectively to the source region and the drain region of the semiconductor layer 12*a* via contact holes formed through a stack of the gate insulating film 13, the first interlayer insulating film 15, and the second interlayer insulating film 17 as shown in FIG. 3.

In each subpixel P, the second TFT 9*b* is electrically connected to an associated one of the first TFTs 9*a*, an associated one of the power supply lines 21*a*, and an associated one of the third TFTs 9*c* as shown in FIG. 4. The second TFT 9*b* has substantially the same structure as the first TFT 9*a* and the third TFT 9*c* (which is described later).

In each subpixel P, the third TFT 9*c* is electrically connected to an associated one of the second TFTs 9*b*, an associated one of the power supply lines 21*a*, and an associated one of the light-emission control lines 14*e* as shown in FIG. 4. The third TFT 9*c* includes the semiconductor layer 12*b*, the gate insulating film 13, the gate electrode 14*b*, the first interlayer insulating film 15, the second interlayer insulating film 17, and the source electrode 18*c* and the drain electrode 18*d*, all of which are sequentially provided on the base coat film 11, as shown in FIG. 3. The semiconductor layer 12*b* is provided on the base coat film 11 and similarly to the semiconductor layer 12*a*, has a channel region, a source region, and a drain region, as shown in FIG. 3. The gate insulating film 13 is provided so as to cover the semiconductor layer 12*b* as shown in FIG. 3. The gate electrode 14*b* is provided on the gate insulating film 13 so as to overlap the channel region of the semiconductor layer 12*b* as shown in FIG. 3. The first interlayer insulating film 15 and the second interlayer insulating film 17 are sequentially provided so as to cover the gate electrode 14*b* as shown in FIG. 3. The source electrode 18*c* and the drain electrode 18*d* are provided on the second interlayer insulating film 17 so as to be separated by a distance from each other as shown in FIG. 3. The source electrode 18*c* and the drain electrode 18*d* are also electrically connected respectively to the source region and the drain region of the semiconductor layer 12*b* via contact holes formed through the stack of the gate insulating film 13, the first interlayer insulating film 15, and the second interlayer insulating film 17 as shown in FIG. 3. The drain electrode 18*d* is electrically connected to an associated one of the relay electrodes 21*b* via a contact hole formed through the first planarization film 19*a* and the third interlayer insulating film 20*a* as shown in FIG. 3.

The present embodiment discusses an example where the first TFTs 9*a*, the second TFTs 9*b*, and the third TFTs 9*c* are all top-gate TFTs. Alternatively, the first TFTs 9*a*, the second TFTs 9*b*, and the third TFTs 9*c* may be bottom-gate TFTs.

In each subpixel P, the capacitor 9*d* is electrically connected to an associated one of the first TFTs 9*a* and an associated one of the power supply lines 21*a* as shown in FIG. 4. The capacitor 9*d* includes: the lower conductive layer 14*c* as the first wiring layer; the first interlayer insulating film 15 provided so as to cover the lower conductive layer 14*c*; and the upper conductive layer 16*a* provided as a second wiring layer on the first interlayer insulating film 15 so as to overlap the lower conductive layer 14*c*, as shown in FIG. 3. The upper conductive layer 16*a* is electrically connected to the power supply line 21*a* via a contact hole (not shown) formed through the second interlayer insulating film 17, the first planarization film 19*a*, and the third interlayer insulating film 20*a*.

The first planarization film 19*a*, the second planarization film 22*a*, and an edge cover 32*a* (which is described later) are made of, for example, an organic resin material such as a polyimide resin, an acrylic resin, or a novolac resin.

The third interlayer insulating film 20*a* is provided as a first inorganic insulating film and made of, for example, a monolayer film of, for example, silicon nitride, silicon oxide, or silicon oxynitride or a stack of these monolayer films.

The organic EL element layer 35 includes a plurality of first electrodes 31*a*, the edge cover 32*a*, the plurality of organic EL layers 33, and a second electrode 34, all of which are sequentially stacked on the TFT layer 30, as shown in FIG. 3.

The plurality of first electrodes 31*a* are arranged in a matrix on the second planarization film 22*a* in such a manner as to correspond to the plurality of subpixels P as shown in FIG. 3. Each first electrode 31*a* is electrically connected to the drain electrode 18*d* of an associated one of the third TFTs 9*c* via a contact hole formed through the first planarization film 19*a* and the third interlayer insulating film 20*a* and a contact hole formed through the relay electrode 21*b* and the second planarization film 22*a*, as shown in FIG. 3. The first electrode 31*a* has a function of injecting holes to the organic EL layer 33. The first electrode 31*a* is more preferably made of a material that has a large work function to improve the efficiency of hole injection to the organic EL layer 33. Examples of the material for the first electrode 31*a* include metals such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Alternatively, the first electrode 31*a* may be made of, for example, an alloy such as an astatine-astatine oxide (At—$AtO_2$) alloy. As another alternative, the first electrode 31*a* may be made of, for example, an electrically conductive oxide such as tin oxide (SnO), zinc oxide (ZnO), indium tin oxide (ITO), or indium zinc oxide (IZO). The first electrode 31*a* may include a stack of layers of any of these materials. Examples of compound materials that have a large work function include indium tin oxide (ITO) and indium zinc oxide (IZO).

The edge cover 32*a* is provided in a lattice form commonly to the plurality of subpixels P, so as to cover the peripheral end portion of each first electrode 31*a* as shown in FIG. 3.

The plurality of organic EL layers 33 are provided on the plurality of first electrodes 31*a* and arranged in a matrix in such a manner as to correspond to the plurality of subpixels P as shown in FIG. 3. Each organic EL layer 33, as shown in FIG. 5includes a hole injection layer 1, a hole transport layer 2, a light-emitting layer 3, an electron transport layer 4, and an electron injection layer 5, all of which are sequentially provided on the first electrode 31*a*.

The hole injection layer 1 is alternatively referred to as the anode buffer layer and provided as a common functional layer that has a function of bringing the energy levels of the first electrode 31*a* and the organic EL layer 33 closer together to improve the efficiency of hole injection from the first electrode 31*a* to the organic EL layer 33 and that is common to the plurality of subpixels P. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 is provided as a common functional layer that has a function of improving the efficiency of hole transport from the first electrode 31*a* to the organic EL layer 33 and that is common to the plurality of subpixels P. The hole transport layer 2 is made of, for example, a porphyrin derivative, an aromatic tertiary amine compound, a styryl amine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styryl anthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is provided as an individual functional layer for each subpixel P and injected with holes and electrons from the first electrode 31*a* and the second electrode 34 respectively when the light-emitting layer 3 is under voltage applied by the first electrode 31*a* and the second electrode 34. These holes and electrons recombine in the light-emitting layer 3. The light-emitting layer 3 is made of a material that has a high luminous efficiency. The light-emitting layer 3 is made of, for example, a metal oxinoid compound (8-hydroxy quinoline metal complex), a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styryl amine derivative, a bis (styryl) benzene derivative, a tris (styryl) benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 is provided as a common functional layer that has a function of efficiently transporting electrons to the light-emitting layer 3 and that is common to the plurality of subpixels P. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 34 and the organic EL layer 33 closer together to improve the efficiency of electron injection from the second electrode 34 to the organic EL layer 33. This function can lower the drive voltage of the organic EL elements in the organic EL element layer 35. The electron injection layer 5 is alternatively referred to as the cathode buffer layer and provided as a common functional layer that is common to the plurality of subpixels P. The electron injection layer 5 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 34 is, as shown in FIG. 3, provided so as to cover the organic EL layers 33 and the edge cover 32*a* commonly to the plurality of subpixels P. The second electrode 34 has a function of injecting electrons to the organic EL layers 33. The second electrode 34 is more preferably made of a material that has a small work function to improve the efficiency of electron injection to the organic EL layers 33. The second electrode 34 is made of, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), or lithium fluoride (LiF). Alternatively, the second electrode 34 may be made of, for example, an alloy such as a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrode 34 may be made of, for example, an electrically conductive oxide such as tin oxide (SnO), zinc oxide (ZnO), indium tin oxide (ITO), or indium zinc oxide (IZO). As a further alternative, the second electrode 34 may include a stack of layers of any of these materials. Examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

As shown in FIGS. 3, 6, 7, and 10, the sealing film 40 is provided so as to cover the second electrode 34, includes a first inorganic sealing film 36, an organic sealing film 37, and a second inorganic sealing film 38, all of which are sequentially stacked on the second electrode 34, and has a function of protecting the organic EL layers 33 in the organic EL element layer 35 from, for example, water and oxygen. The first inorganic sealing film 36 and the second inorganic sealing film 38 are made of, for example, an inorganic insulating film such as a silicon nitride film, a silicon oxide film, or a silicon oxynitride film. The organic sealing film 37 is made of, for example, an organic resin material such as an acrylic resin, an epoxy resin, a silicone resin, a polyurea resin, a parylene resin, a polyimide resin, or a polyamide resin.

The organic EL display device 50*a*, as shown in FIG. 1, includes, in the frame area F: a first outer damming wall Wa provided, external to the trench G, like a rectangular frame surrounding the display area D; and a second outer damming wall Wb provided like a rectangular frame surrounding the first outer damming wall Wa.

The first outer damming wall Wa, as shown in FIGS. 6 and 7, includes: a bottom-level resin layer 22*b* made of the same material, and provided in the same layer, as the second planarization film 22*a*; and a top-level resin layer 32*b* made of the same material, and provided in the same layer, as the edge cover 32*a*. The first outer damming wall Wa is, as shown in FIGS. 6 and 7, provided so as to overlap an outer peripheral portion of the organic sealing film 37 in the sealing film 40 and structured so as to restrain the ink that will form the organic sealing film 37 in the sealing film 40 from spreading.

The second outer damming wall Wb, as shown in FIGS. 6 and 7, includes: a bottom-level resin layer 19*b* made of the same material, and provided in the same layer, as the first planarization film 19*a*; a mid-level resin layer 22*c* made of the same material, and provided in the same layer, as the second planarization film 22*a*; and a top-level resin layer 32*c* made of the same material, and provided in the same layer, as the edge cover 32*a*.

The organic EL display device 50*a*, as shown in FIG. 1, includes, in the frame area F, a first frame line 18*h* as the third wiring layer that has: a portion extending like a band with a relatively large width where the trench G is open; a portion extending linearly internal to the trench G on the display area D side; and two ends extending to the terminal section T opposite the display area D. The first frame line 18*h* is electrically connected to the power supply lines 21*a* on the display area D side of the frame area F to be fed with a high-voltage power supply (ELVDD) at the terminal section T. The first frame line 18*h* and a second frame line 18*i* (which is described later) are made of the same material, and provided in the same layer, as the source electrodes 18*a* and 18*c* and the drain electrodes 18*b* and 18*d* as shown in FIGS. 6 and 7. The first frame line 18*h* and the second frame line 18*i* each include a first metal layer 6, a second metal layer 7, and a third metal layer 8, all of which are sequentially stacked from the resin substrate layer 10 side toward the organic EL element layer 35 side. The first metal layer 6 and the third metal layer 8 each include a titanium film with a thickness of, for example, approximately 100 nm to 200 nm. The second metal layer 7 includes an aluminum film with a thickness of, for example, approximately 100 nm to 1,000 nm. The source electrodes 18*a* and 18*c*, the drain electrodes 18*b* and 18*d*, and the source lines 18*f*, as well as routing lines 18*j* (detailed later), since being the third wiring layer similarly to the first frame line 18*h* and the second frame line 18*i*, each include the first metal layer 6, the second metal layer 7, and the third metal layer 8, all of which are sequentially stacked from the resin substrate layer 10 side toward the organic EL element layer 35 side (not shown).

The organic EL display device 50*a*, as shown in FIG. 1, includes, in the frame area F, the second frame line 18*i* as the third wiring layer provided external to the trench G so as to form a generally C-shape and having two ends extending to the terminal section T. The second frame line 18*i* is, as shown in FIG. 6, electrically connected to the second electrode 34 via a first conductive layer 31*b* in the trench G to be fed with a low-voltage power supply (ELVSS) at the terminal section T. The first conductive layer 31*b* is made of the same material, and provided in the same layer, as the first electrodes 31*a* and provided, in the frame area F, so as to overlap the second frame line 18*i* and the second electrode 34 to electrically connect the second frame line 18*i* and the second electrode 34, as shown in FIG. 6.

The organic EL display device 50*a*, as shown in FIG. 8, includes, in the bending portion B of the frame area F: an injection resin layer 25 provided so as to fill a slit S formed in the base coat film 11, the gate insulating film 13, the first interlayer insulating film 15, and the second interlayer insulating film 17; the plurality of routing lines 18*j* provided on the injection resin layer 25 and the second interlayer insulating film 17; and a covering resin layer 19*c* provided so as to cover the routing lines 18*j*. The slit S is provided, as shown in FIG. 8, like a groove that that runs through the base coat film 11, the gate insulating film 13, the first interlayer insulating film 15, and the second interlayer insulating film 17 and that passes all the way through in the direction in which the bending portion B extends so as to expose the surface of the resin substrate layer 10. The injection resin layer 25 is made of, for example, an organic resin material such as a polyimide resin. The plurality of routing lines 18*j* are provided so as to extend parallel to each other in a direction perpendicular to the direction in which the bending portion B extends. Both ends of each routing line 18*j* are, as shown in FIG. 8, electrically connected respectively to a first gate conductive layer 14*f* and a second gate conductive layer 14*g* via contact holes formed through a stack of the first interlayer insulating film 15 and the second interlayer insulating film 17. The routing lines 18*j* are provided as the third wiring layer as described above and made of the same material, and provided in the same layer, as the source electrodes 18*a* and 18*c* and the drain electrodes 18*b* and 18*d*. The first gate conductive layer 14*f* is, as shown in FIG. 8, provided between the gate insulating film 13 and the first interlayer insulating film 15 and electrically connected to the signal lines (e.g., the source lines 18*f* and the gate lines 14*d*) extending in the display area D. The second gate conductive layer 14*g* is, as shown in FIG. 8, provided between the gate insulating film 13 and the first interlayer insulating film 15 and electrically connected to, for example, a terminal of the terminal section T. The covering resin layer 19*c* is made of the same material, and provided in the same layer, as the first planarization film 19*a*.

The organic EL display device 50*a*, as shown in FIG. 10, includes, in the frame area F and the non-display area N, a plurality of peripheral photo spacers 32*d* provided on the second planarization film 22*a* in an insular manner so as to project upward in the drawing. The peripheral photo spacers 32*d* are made of the same material, and provided in the same layer, as the edge cover 32*a*.

The organic EL display device 50*a*, as shown in FIGS. 9 and 10, includes, in the non-display area N, a partition wall Ea provided like a circular frame surrounding the through hole H.

The partition wall Ea is made of the same material, and provided in the same layer, as the third wiring layer and is shaped like a frame. The partition wall Ea has, on the through hole H side of an upper side segment on the organic EL element layer 35 side, an edge that is shaped like an eave so as to project beyond the edge on the through hole H side of a lower side segment on the resin substrate layer 10 side toward the through hole H side. Specifically, the partition wall Ea, as shown in FIG. 10, includes: a wall bottom portion 6*a* made of the same material, and provided in the same layer, as the first metal layer 6 and shaped like a frame; a wall middle portion 7*a* made of the same material, and provided in the same layer, as the second metal layer 7 and shaped like a frame; and a wall top portion 8*a* made of the same material, and provided in the same layer, as the third metal layer 8 and shaped like a frame. The wall top portion 8*a* has, on the through hole H side thereof, an edge that is shaped like an eave so as to project, for example, approximately 1 μm beyond the edge of the wall middle portion 7*a* on the through hole H side toward the through hole H side, as shown in FIG. 10. On the partition wall Ea is there provided an inorganic insulating layer 20*b* made of the same material, and provided in the same layer, as the third interlayer insulating film 20*a* and shaped like a frame as shown in FIG. 10. On the resin substrate layer 10 side of the partition wall Ea, a film (second inorganic insulating film) of a stack of the base coat film 11, the gate insulating film 13, the first interlayer insulating film 15, and the second interlayer insulating film 17 is provided toward the through hole H side as shown in FIG. 10.

Owing to the partition wall Ea described here, the second electrode 34, the hole injection layer 1, the hole transport layer 2, the electron transport layer 4, and the electron injection layer 5 are, as shown in FIG. 10, provided on the partition wall Ea via the inorganic insulating layer 20*b* all across from the display area D to the through hole H and separated from a through hole H side portion in the peripheral end portion of the wall top portion 8*a* on the through hole H side. Note that although FIG. 10 does not show the hole injection layer 1, the hole transport layer 2, the electron transport layer 4, and the electron injection layer 5, the common functional layer containing the hole injection layer 1, the hole transport layer 2, the electron transport layer 4, and the electron injection layer 5 is, similarly to the second electrode 34, separated from a through hole H side portion in the peripheral end portion of the wall top portion 8*a* on the through hole H side. In addition, although the present embodiment discusses an example where the hole injection layer 1, the hole transport layer 2, the electron transport layer 4, and the electron injection layer 5 are all a common functional layer, at least one of the hole injection layer 1, the hole transport layer 2, the electron transport layer 4, and the electron injection layer 5 may be a common functional layer. In the non-display area N, the second inorganic sealing film 38 in the sealing film 40 is, as shown in FIG. 10, provided so as to cover the partition wall Ea via the inorganic insulating layer 20*b* and the first inorganic sealing film 36 in the sealing film 40. The first inorganic sealing film 36 is, as shown in FIG. 10, provided in contact with the second electrode 34 on the second interlayer insulating film 17 in the TFT layer 30 in the non-display area N.

The organic EL display device 50*a*, as shown in FIGS. 9 and 10, includes, in the non-display area N, a first inner damming wall Wc and a second inner damming wall Wd both shaped like a circular frame surrounding the partition wall Ea.

The first inner damming wall Wc, as shown in FIG. 10, includes: a first resin layer 22*e* made of the same material, and provided in the same layer, as the second planarization film 22*a*; and a second resin layer 32*e* provided on the first resin layer 22*e* and made of the same material, and provided in the same layer, as the edge cover 32*a*. The first inner damming wall Wc is, as shown in FIG. 10, provided in the display area D side of the non-display area N so as to overlap an inner peripheral portion of an organic sealing film 37 that forms the sealing film 40 and structured so as to restrain the ink that will form the organic sealing film 37 in the sealing film 40 from spreading.

The second inner damming wall Wd, as shown in FIG. 10, includes: a first resin layer 22*f* made of the same material, and provided in the same layer, as the second planarization film 22*a*; and a second resin layer 32*f* provided on the first resin layer 22*f* and made of the same material, and provided in the same layer, as the edge cover 32*a*. The second inner damming wall Wd is, as shown in FIGS. 9 and 10, provided between the first inner damming wall Wc and the partition wall Ea in the non-display area N.

In the non-display area N, the gate insulating film 13, the first interlayer insulating film 15, and the second interlayer insulating film 17 are, as shown in FIG. 10, provided so as not to reach a side face of the through hole H. In a peripheral portion of the through hole H, is there provided a semiconductor layer 12*c* as an etching stopper in such a manner as to be exposed from the gate insulating film 13, the first interlayer insulating film 15, and the second interlayer insulating film 17, as shown in FIG. 10. The semiconductor layer 12*c* is made of the same material, and provided in the same layer, as the semiconductor layers 12*a* and 12*b*. FIG. 10 shows, an example, a structure where the base coat film 11 and the semiconductor layer 12*c* are provided to remain as an inorganic film in the TFT layer 30 in a peripheral portion of the through hole H. Alternatively, it may be only the base coat film 11 that remains. As another alternative, the base coat film 11 and the semiconductor layer 12*c* may be provided so as not to reach a side face of the through hole H, exposing the resin substrate layer 10. In a peripheral portion of the through hole H, a thin inorganic film is preferably formed to restrain cracks propagating in the inorganic film.

In the organic EL display device 50*a* described so far, in each subpixel P, a gate signal is fed to the first TFT 9*a* via the gate line 14*d*, turning on the first TFT 9*a*. A prescribed voltage corresponding to a source signal is hence written via the source line 18*f* to the gate electrode 14*b* of the second TFT 9*b* and the capacitor 9*d*. A light-emission control signal is fed to the third TFT 9*c* via the light-emission control line 14*e*, turning on the third TFT 9*c*. A current in accordance with the gate voltage of the second TFT 9*b* is fed from the power supply line 21*a* to the organic EL layer 33, causing the light-emitting layer 3 in the organic EL layer 33 to emit light to produce an image display. In the organic EL display device 50*a*, the gate voltage of the second TFT 9*b* is retained by the capacitor 9*d* when the first TFT 9*a* is turned off. The light-emitting layer 3 in the subpixel P therefore continuously emits light until a gate signal is fed in a next frame.

A description is given next of a method of manufacturing the organic EL display device 50*a* in accordance with the present embodiment. The method of manufacturing the organic EL display device 50*a* in accordance with the present embodiment includes a TFT layer forming step, an organic EL element layer forming step, a sealing film forming step, and a through hole forming step. The TFT layer forming step includes a partition wall forming step. FIGS. 11, 12, 13, and 14 are all cross-sectional views illustrating successive parts of the partition wall forming step in the method of manufacturing the organic EL display device 50*a*.

TFT Layer Forming Step

As an example, the base coat film 11, the first TFTs 9*a*, the second TFTs 9*b*, the third TFTs 9*c*, the capacitors 9*d*, the first planarization film 19*a*, the third interlayer insulating film 20*a*, the power supply lines 21*a*, and the second planarization film 22*a* are formed by a well-known method on a surface of the resin substrate layer 10 formed on a glass substrate, to form the TFT layer 30.

The following will describe a partition wall forming step of forming the partition wall Ea by using the step of forming the first TFTs 9*a*, the second TFTs 9*b*, the third TFTs 9*c*, and the third interlayer insulating film 20*a* in the TFT layer forming step.

Figure 11:
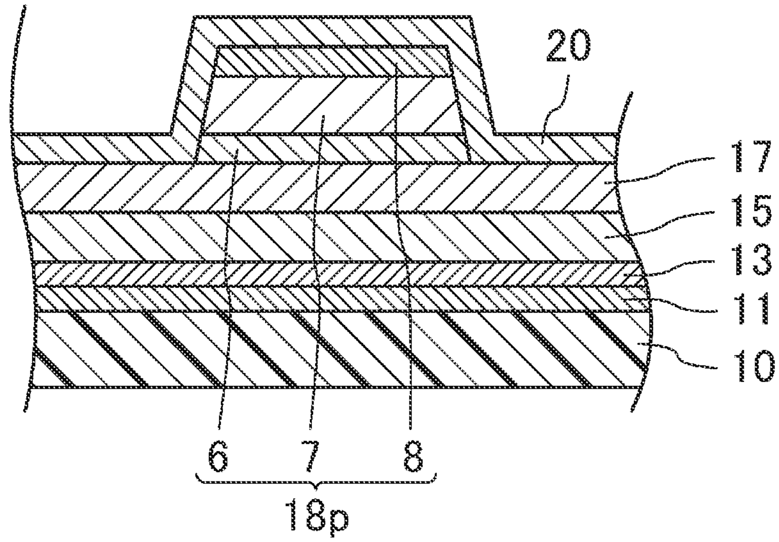
FIG. 11 is a cross-sectional view illustrating a part of a partition wall forming step in a method of manufacturing the organic EL display device in accordance with the first embodiment of the disclosure.

First, a partition wall forming layer 18*p* in which the first metal layer 6 (e.g., a titanium layer with a thickness of approximately 30 nm), the second metal layer 7 (e.g., an aluminum layer with a thickness of approximately 630 nm), and the third metal layer 8 (e.g., a titanium layer with a thickness of approximately 30 nm) are sequentially stacked in the non-display area N is formed like a circular frame in the display area D in forming, for example, the source electrodes 18*a* and 18*c* and the drain electrodes 18*b* and 18*d* (see FIG. 11).

Then, a photosensitive polyimide resin is applied by, for example, spin-coating to a surface of the substrate on which, for example, the source electrodes 18*a* and 18*c* and the drain electrodes 18*b* and 18*d* are formed. After forming a photosensitive resin film, this photosensitive resin film is subjected to optical exposure, development, and baking, to form the first planarization film 19*a* in the display area D and to form the bottom-level resin layer 19*b* and the covering resin layer 19*c* in the frame area F.

Figure 12:
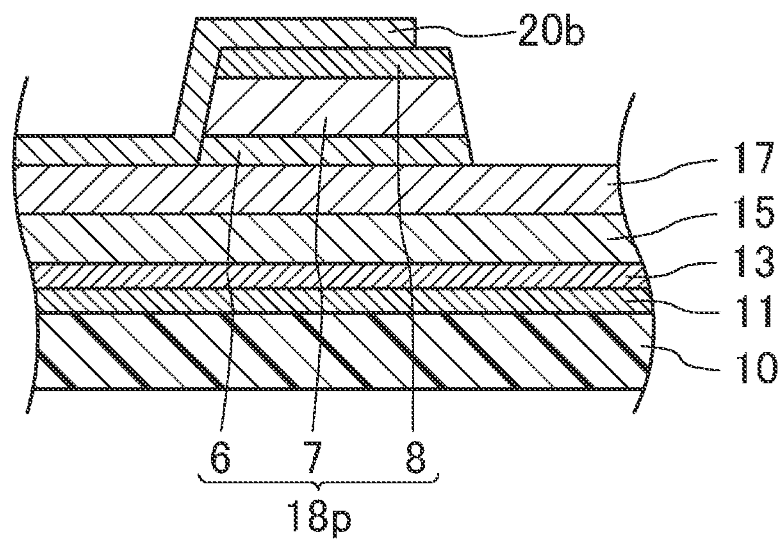
FIG. 12, continuing from FIG. 11, is a cross-sectional view illustrating a part of the partition wall forming step in the method of manufacturing the organic EL display device in accordance with the first embodiment of the disclosure.

Subsequently, a silicon oxynitride film (of a thickness of approximately 10 nm to 500 nm) is formed by, for example, plasma CVD (chemical vapor deposition) on a surface of the substrate on which, for example, the first planarization film 19*a* has been formed. After forming an inorganic insulating film 20, this inorganic insulating film 20 is patterned to form the third interlayer insulating film 20*a* in the display area D as shown in FIG. 11, thereby forming the inorganic insulating layer 20*b* in the non-display area N as shown in FIG. 12.

Figure 13:
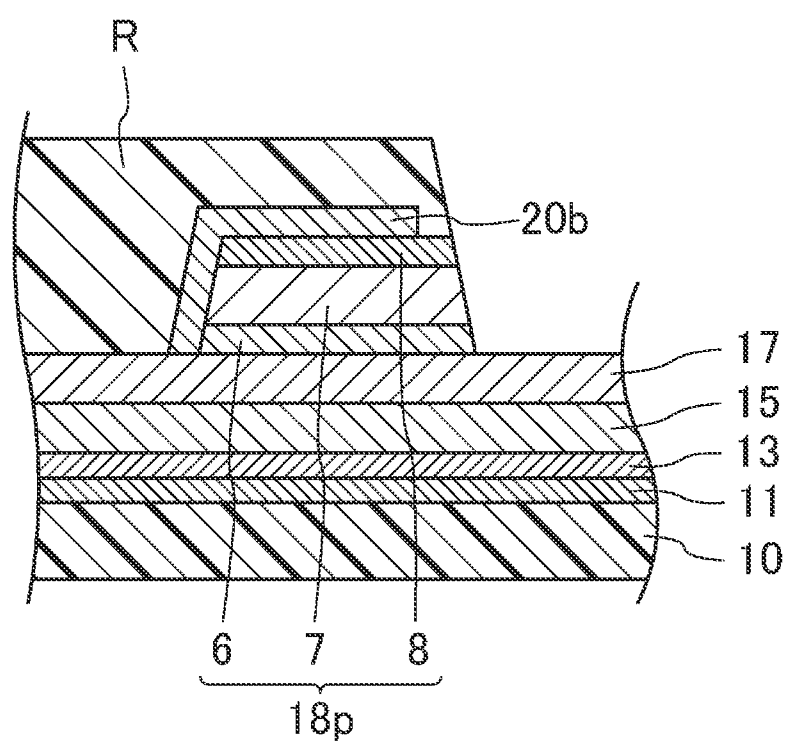
FIG. 13, continuing from FIG. 12, is a cross-sectional view illustrating a part of the partition wall forming step in the method of manufacturing the organic EL display device in accordance with the first embodiment of the disclosure.
Figure 14:
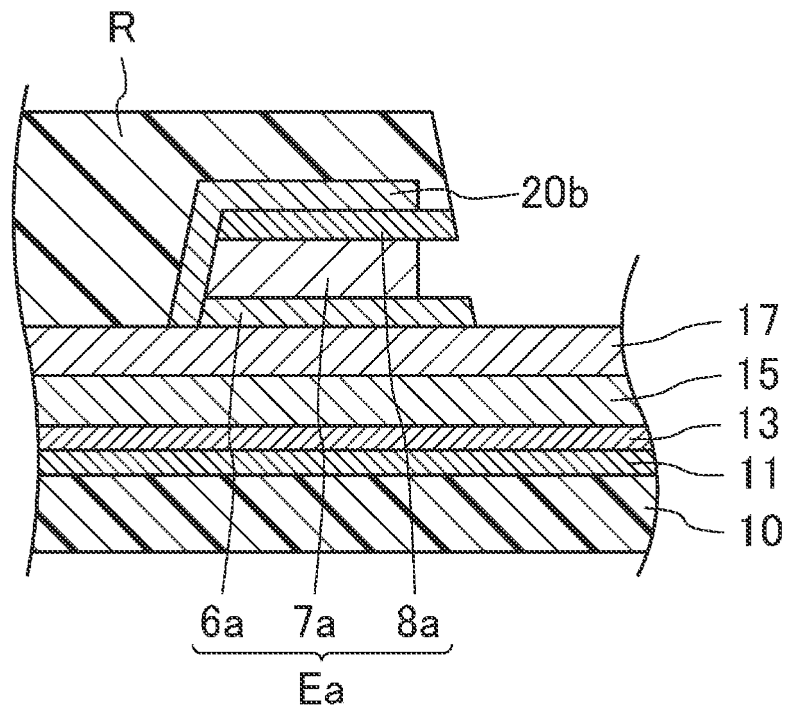
FIG. 14, continuing from FIG. 13, is a cross-sectional view illustrating a part of the partition wall forming step in the method of manufacturing the organic EL display device in accordance with the first embodiment of the disclosure.

Furthermore, after forming a resist pattern R on the inorganic insulating layer 20*b* as shown in FIG. 13, that edge of the partition wall forming layer 18*p* which is exposed from the resist pattern R is removed from around the edge of the second metal layer 7 by, for example, dry etching using chlorine gas, to form the wall bottom portion 6*a*, the wall middle portion 7*a*, and the wall top portion 8*a* as shown in FIG. 14. The partition wall Ea is hence formed in which the edge of the wall top portion 8*a* on the through hole H side is shaped like an eave so as to project beyond the edge of the wall middle portion 7*a* on the through hole H side toward the through hole H side.

Organic EL Element Layer Forming Step

The first electrodes 31*a*, the edge cover 32*a*, the organic EL layers 33 (the hole injection layer 1, the hole transport layer 2, the light-emitting layer 3, the electron transport layer 4, and the electron injection layer 5), and the second electrode 34 are formed by a well-known method on the second planarization film 22*a* in the TFT layer 30 formed in the previous TFT layer forming step, to form the organic EL element layer 35. In forming the organic EL layers 33 and the second electrode 34 by vapor deposition, the hole injection layer 1, the hole transport layer 2, the electron transport layer 4, the electron injection layer 5, and the second electrode 34, all of which are parts of the organic EL layers 33, are, in the eave-shaped portion of the wall top portion 8*a* of the partition wall Ea, formed separated from the side where the through hole H will be formed later.

Sealing Film Forming Step

First, for example, an inorganic insulating film such as a silicon nitride film, a silicon oxide film, or a silicon oxynitride film is formed by, for example, plasma CVD using a mask on a surface of the substrate on which the organic EL element layer 35 was formed in the previous organic EL element layer forming step, form the first inorganic sealing film 36.

Subsequently, a film of an organic resin material such as an acrylic resin is formed by, for example, inkjet technology on a surface of the substrate on which the first inorganic sealing film 36 has been formed, to form the organic sealing film 37.

Thereafter, the second inorganic sealing film 38 is formed by forming an inorganic insulating film such as a silicon nitride film, a silicon oxide film, or a silicon oxynitride film by plasma CVD using a mask on the substrate on which the organic sealing film 37 has been formed, to form the sealing film 40.

Through Hole Forming Step

First, after attaching a protection sheet (not shown) to a surface of the substrate on which the sealing film 40 was formed in the previous sealing film forming step, the glass substrate is detached from the bottom face of the resin substrate layer 10 under the laser light shone from the glass substrate side of the resin substrate layer 10. Furthermore, a protection sheet (not shown) is attached to the bottom face of the resin substrate layer 10 from which the glass substrate has been detached.

Subsequently, the through hole H with a diameter of approximately 5 mm is formed by, for example, shining circularly scanning laser light onto the region overlapping the semiconductor layer 12*c* internal to the partition wall Ea provided in the resin substrate layer 10 to which the protection sheet has been attached.

Thereafter, when the organic EL display device 50*a* in which the through hole H has been formed is, for example, fixed inside a housing, the electronic components 60 such as a camera and a fingerprint sensor are mounted so that the electronic components 60 can sit on the backside of the through hole H.

The organic EL display device 50*a* in accordance with the present embodiment can be thus manufactured.

As described above, in the organic EL display device 50*a* in accordance with the present embodiment, the partition wall Ea is provided like a circular frame, extending along the rim of the through hole H in the insular non-display area N where the through hole H is formed in the display area D. The partition wall Ea includes: the wall bottom portion 6*a* made of the same material, and provided in the same layer, as the first metal layer 6 and shaped like a frame; the wall middle portion 7*a* made of the same material, and provided in the same layer, as the second metal layer 7 and shaped like a frame; and the wall top portion 8*a* made of the same material, and provided in the same layer, as the third metal layer 8 and shaped like a frame. In the partition wall Ea, the edge of the wall top portion 8*a* on the through hole H side is shaped like an eave so as to project beyond the edge of the wall middle portion 7*a* on the through hole H side toward the through hole H side. Hence, the common functional layers (the hole injection layer 1, the hole transport layer 2, the electron transport layer 4, and the electron injection layer 5) and the second electrode 34 are formed separately for the display area D side and for the through hole H side in those portions of the partition wall Ea that project like an eave. The step of forming a resist pattern and the step of dry etching using this resist pattern do not need to be repeated a plurality of times to form the partition wall Ea. Therefore, the common functional layers (the hole injection layer 1, the hole transport layer 2, the electron transport layer 4, and the electron injection layer 5) and the second electrode 34 can be formed separately for the display area D side and for the through hole H side at low cost.

In addition, in the organic EL display device 50*a* in accordance with the present embodiment, the first inorganic sealing film 36 is provided so as to cover the edge of the second electrode 34 on the through hole H side in the non-display area N. This structure can ensure the sealing capability of the sealing film 40 even in the non-display area N, thereby restraining degradation of the organic EL layers 33 and improving the reliability of the organic EL display device 50*a*.

Second Embodiment

Figure 15:
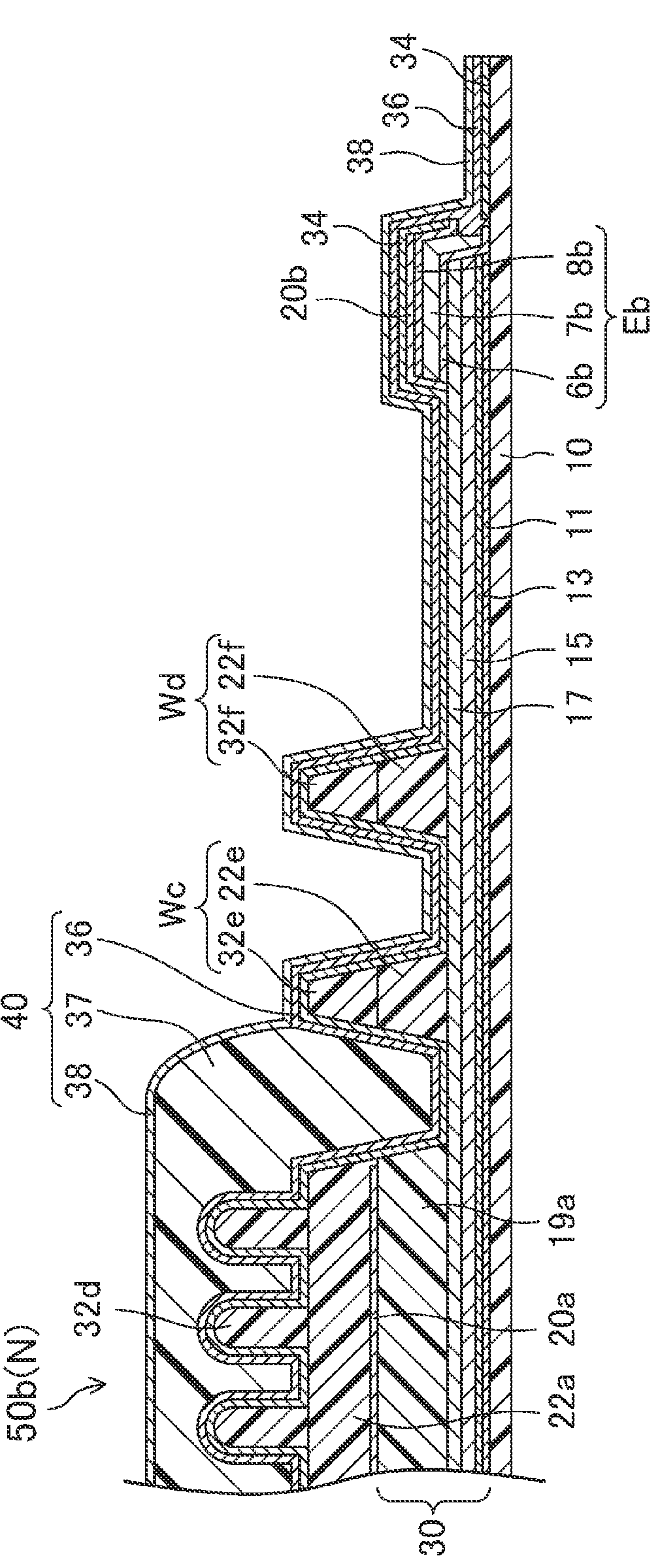
FIG. 15, corresponding to FIG. 10, is a cross-sectional view of a non-display area of an organic EL display device in accordance with a second embodiment of the disclosure.
Figure 16:
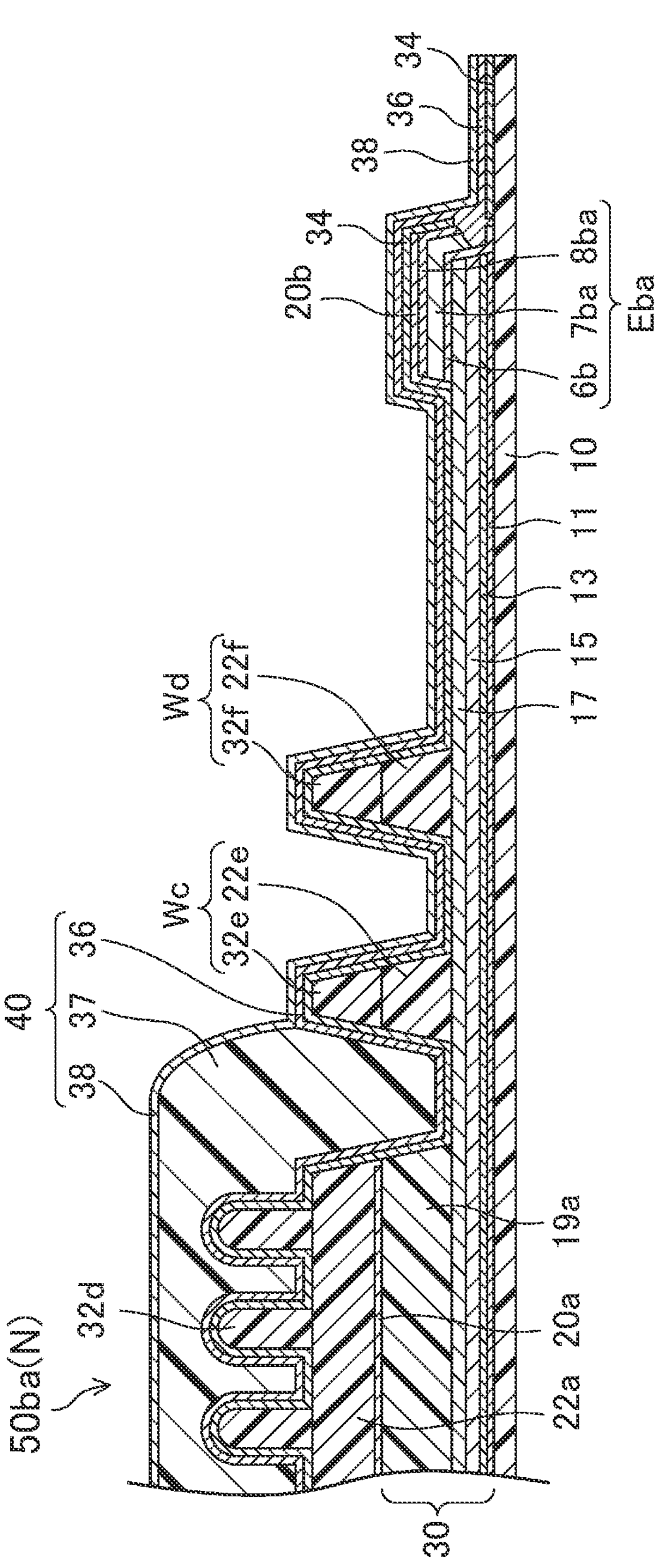
FIG. 16, corresponding to FIG. 10, is a cross-sectional view of a non-display area of a variation example of the organic EL display device in accordance with the second embodiment of the disclosure.

FIGS. 15 and 16 represent a second embodiment of the display device of the disclosure. FIG. 15 is a cross-sectional view of a non-display area N of an organic EL display device 50*b* in accordance with the present embodiment, corresponding to FIG. 10. FIG. 16 is a cross-sectional view of a non-display area N of an organic EL display device 50*b* as a variation example of the organic EL display device 50*b*, corresponding to FIG. 10. Members of this and subsequent embodiments that are the same as those shown in FIGS. 1 to 14 are indicated by the same reference numerals, and detailed description thereof is omitted.

The first embodiment above has discussed, as an example, the organic EL display device 50*a* in which the base coat film 11, the gate insulating film 13, the first interlayer insulating film 15, and the second interlayer insulating film 17 on the resin substrate layer 10 side of the partition wall Ea are provided toward the through hole H side. In contrast, the present embodiment discusses, as an example, the organic EL display device 50*b* in which the base coat film 11, the gate insulating film 13, the first interlayer insulating film 15, and the second interlayer insulating film 17 on the resin substrate layer 10 side of a partition wall Eb are provided so as not to extend beyond the partition wall Eb.

The organic EL display device 50*b*, similarly to the organic EL display device 50*a* in accordance with the first embodiment described above, has: a display area D in which the insular non-display area N is provided; and a frame area F surrounding the display area D.

The organic EL display device 50*b*, similarly to the organic EL display device 50*a* in accordance with the first embodiment described above, includes: the resin substrate layer 10; a TFT layer 30 on the resin substrate layer 10; an organic EL element layer 35 on the TFT layer 30; and a sealing film 40 on the organic EL element layer 35.

The display area D and the frame area F of the organic EL display device 50*b* has generally the same structure as the display area D and the frame area F of the organic EL display device 50*a* in accordance with the first embodiment described above.

The organic EL display device 50*b*, similarly to the organic EL display device 50*a* in accordance with the first embodiment described above, includes the partition wall Eb provided in the non-display area N like a circular frame surrounding the through hole H as shown in FIG. 15.

The partition wall Eb, as shown in FIG. 15, includes: a wall bottom portion 6*b* made of the same material, and provided in the same layer, as the first metal layer 6 and shaped like a frame; a wall middle portion 7*b* made of the same material, and provided in the same layer, as the second metal layer 7 and shaped like a frame; and a wall top portion 8*b* made of the same material, and provided in the same layer, as the third metal layer 8 and shaped like a frame. The wall top portion 8*b* has, on the through hole H side thereof, an edge that is shaped like an eave so as to project, for example, approximately 1 μm beyond the edge of the wall middle portion 7*b* on the through hole H side toward the through hole H side. On the partition wall Eb is there provided an inorganic insulating layer 20*b* as shown in FIG. 15. On the resin substrate layer 10 side of the partition wall Eb, a film (second inorganic insulating film) of a stack of the base coat film 11, the gate insulating film 13, the first interlayer insulating film 15, and the second interlayer insulating film 17 is provided so as not to extend beyond the partition wall Eb as shown in FIG. 15. The partition wall Eb is provided so as to cover the edge of the film (second inorganic insulating film) of a stack of the base coat film 11, the gate insulating film 13, the first interlayer insulating film 15, and the second interlayer insulating film 17 on the through hole H side as shown in FIG. 15.

The present embodiment has so far discussed, as an example, the organic EL display device 50*b* including the partition wall Eb in which the wall bottom portion 6*b* and the wall middle portion 7*b* are provided so as to cover the edge of the second inorganic insulating film on the through hole H side. Alternatively, the organic EL display device 50*ba* is also possible that includes a partition wall Eba shown in FIG. 16. Specifically, in the organic EL display device 50*ba*, which is a variation example, the wall middle portion 7*b* and the wall top portion 8*b* of the partition wall Eb in the organic EL display device 50*b* are etched further in the horizontal direction to provide a wall middle portion 7*ba* and a wall top portion 8*ba* as shown in FIG. 16, and only the wall bottom portion 6*b* is provided to cover the edge of the second inorganic insulating film on the through hole H side. In the organic EL display device 50*ba*, the wall bottom portion 6*b*, the wall middle portion 7*ba*, and the wall top portion 8*ba*, which are sequentially stacked, constitute the partition wall Eba as shown in FIG. 16.

Owing to the partition wall Eb described above, the second electrode 34, the hole injection layer 1, the hole transport layer 2, the electron transport layer 4, and the electron injection layer 5 are, as shown in FIG. 15, provided on the partition wall Eb via the inorganic insulating layer 20*b* all across from the display area D to the through hole H and separated from a through hole H side portion in the peripheral end portion of the wall top portion 8*b* on the through hole H side. Note that although FIG. 15 (FIG. 16) does not show the hole injection layer 1, the hole transport layer 2, the electron transport layer 4, and the electron injection layer 5, the common functional layer containing the hole injection layer 1, the hole transport layer 2, the electron transport layer 4, and the electron injection layer 5 is, similarly to the second electrode 34, separated from a through hole H side portion in the peripheral end portion of the wall top portion 8*b* (8*ba*) on the through hole H side. In addition, although the present embodiment discusses an example where the hole injection layer 1, the hole transport layer 2, the electron transport layer 4, and the electron injection layer 5 are all common functional layers, at least one of the hole injection layer 1, the hole transport layer 2, the electron transport layer 4, and the electron injection layer 5 may be a common functional layer. In the non-display area N, the second inorganic sealing film 38 in the sealing film 40 is, as shown in FIG. 15, provided so as to cover the partition wall Eb via the inorganic insulating layer 20*b* and the first inorganic sealing film 36 in the sealing film 40. The first inorganic sealing film 36 is, as shown in FIG. 15, provided in contact with the resin substrate layer 10 in the non-display area N.

Similarly to the organic EL display device 50*a* in accordance with the first embodiment described earlier, the organic EL display device 50*b*, as shown in FIG. 15, includes, in the non-display area N, a first inner damming wall Wc and a second inner damming wall Wd both shaped like a circular frame surrounding the partition wall Eb.

Similarly to the organic EL display device 50*a* in accordance with the first embodiment described earlier, the organic EL display device 50*b* described above is flexible and structured so as to produce an image display by causing the light-emitting layer 3 in the organic EL layer 33 to emit light in a suitable manner by means of the first TFT 9*a*, the second TFT 9*b*, and the third TFT 9*c* in each subpixel P.

The organic EL display device 50*b* in accordance with the present embodiment can be manufactured by, although not described in the TFT layer forming step in the method of manufacturing the organic EL display device 50*a* in accordance with the first embodiment described above, patterning the gate insulating film 13, the first interlayer insulating film 15, and the second interlayer insulating film 17 in the non-display area N in removing the base coat film 11, the gate insulating film 13, the first interlayer insulating film 15, and the second interlayer insulating film 17 in the bending portion B to form the slit S before forming, for example, the source electrodes 18*a* and 18*c* and the drain electrodes 18*b* and 18*d*.

As described above, in the organic EL display device 50*b* in accordance with the present embodiment, the partition wall Eb is provided like a circular frame, extending along the rim of the through hole H in the insular non-display area N where the through hole H is formed in the display area D. The partition wall Eb includes: the wall bottom portion 6*b* made of the same material, and provided in the same layer, as the first metal layer 6 and shaped like a frame; the wall middle portion 7*b* made of the same material, and provided in the same layer, as the second metal layer 7 and shaped like a frame; and the wall top portion 8*b* made of the same material, and provided in the same layer, as the third metal layer 8 and shaped like a frame. In the partition wall Eb, the edge of the wall top portion 8*b* on the through hole H side is shaped like an eave so as to project beyond the edge of the wall middle portion 7*b* on the through hole H side toward the through hole H side. Hence, the common functional layers (the hole injection layer 1, the hole transport layer 2, the electron transport layer 4, and the electron injection layer 5) and the second electrode 34 are formed separately for the display area D side and for the through hole H side in that portion of the partition wall Eb that projects like an eave. The step of forming a resist pattern and the step of dry etching using this resist pattern do not need to be repeated a plurality of times to form the partition wall Eb. Therefore, the common functional layers (the hole injection layer 1, the hole transport layer 2, the electron transport layer 4, and the electron injection layer 5) and the second electrode 34 can be formed separately for the display area D side and for the through hole H side at low cost.

In addition, in the organic EL display device 50*b* in accordance with the present embodiment, the first inorganic sealing film 36 is provided so as to cover the edge of the second electrode 34 on the through hole H side in the non-display area N. This structure can ensure the sealing capability of the sealing film 40 even in the non-display area N, thereby restraining degradation of the organic EL layers 33 and improving the reliability of the organic EL display device 50*b*.

Additionally, in the organic EL display device 50*b* in accordance with the present embodiment, the partition wall Eb is provided in the non-display area N so as to cover the edge of the stack of the base coat film 11, the gate insulating film 13, the first interlayer insulating film 15, and the second interlayer insulating film 17 on the through hole H side. Therefore, the stack of the base coat film 11, the gate insulating film 13, the first interlayer insulating film 15, and the second interlayer insulating film 17 serves as an etching stopper in etching the edge of the partition wall forming layer (18*p*) in the horizontal direction to form the partition wall Eb. Hence, the eave-shaped portion of the partition wall Eb is restrained from being formed with unnecessarily large dimensions. That in turn restrains the first inorganic sealing film 36 from being broken due to a large level difference (disconnected due to a level difference), thereby ensuring the sealing capability of the sealing film 40.

OTHER EMBODIMENTS

The foregoing embodiments have discussed, as an example, the organic EL display device where the third wiring layer is used to form a partition wall. The disclosure is also applicable to organic EL display devices where the first wiring layer, the second wiring layer, or another wiring layer is used to form a partition wall.

The foregoing embodiments have discussed, as an example, organic EL layers with a 5-layered structure including a hole injection layer, a hole transport layer, a light-emitting layer, an electron transport layer, and an electron injection layer. Alternatively, the organic EL layer may have, for example, a 3-layered structure including a hole injection and transport layer, a light-emitting layer, and an electron transport and injection layer.

In addition, the foregoing embodiments have discussed, as an example, organic EL display devices including a first electrode as an anode and a second electrode as a cathode. The disclosure is equally applicable to organic EL display devices in which the layered structure of the organic EL layer is reversed, to include a first electrode as a cathode and a second electrode as an anode.

In addition, the foregoing embodiments have discussed, as an example, organic EL display devices in which the TFT connected to the first electrode has an electrode as a drain electrode. The disclosure is equally applicable to organic EL display devices in which the TFT connected to the first electrode has an electrode referred to as a source electrode.

In addition, the foregoing embodiments have discussed organic EL display devices as an example of the display device. The disclosure is equally applicable to display devices including a plurality of current-driven light-emitting elements, for example, applicable to display devices including QLEDs (quantum-dot light-emitting diodes) which are light-emitting elements using a quantum-dot layer.

INDUSTRIAL APPLICABILITY

As described above, the disclosure is useful in flexible display devices.

The invention claimed is:

1. A display device comprising:

a base substrate;

a thin film transistor layer provided on the base substrate and including a wiring layer; and a light-emitting element layer provided on the thin film transistor layer and including a plurality of first electrodes, a plurality of functional layers, and a common second electrode, which are sequentially stacked, in this stated order, in such a manner as to correspond to a plurality of subpixels in a display area, wherein:

an insular non-display area is provided in the display area, a through hole extends in a direction of a thickness of the base substrate in the non-display area, a partition wall is provided in the non-display area such that the partition wall surrounds the through hole, the partition wall is made of a same material, and provided in a same layer, as the wiring layer, the wiring layer includes a first metal layer, a second metal layer, and a third metal layer, all of which are sequentially stacked, in this stated order, from a base substrate side toward a light-emitting element layer side, the partition wall includes:

a wall bottom portion made of a same material, and provided in a same layer, as the first metal layer, and shaped similar to a frame, a wall middle portion made of a same material, and provided in a same layer, as the second metal layer, and shaped similar to a frame, and a wall top portion made of a same material, and provided in a same layer, as the third metal layer, and shaped similar to a frame, wherein the wall top portion comprises, on a through hole side, an edge shaped similar to an eave which projects toward the through hole side beyond an edge of the wall middle portion on the through hole side, without reaching an edge of the wall bottom portion on the through hole side, and the thin film transistor layer includes:

a first inorganic insulating film provided on the light-emitting element layer side of the wiring layer, and an inorganic insulating layer made of a same material, and provided in a same layer, as the first inorganic insulating film, shaped similar to a frame, and provided on the partition wall.

2. The display device according to claim 1, wherein the plurality of functional layers includes a common functional layer that is common to the plurality of subpixels, and the common functional layer and the second electrode are provided on the partition wall via the inorganic insulating layer from the display area to the non-display area, and are separated from a portion on the through hole side along the edge of the wall top portion on the through hole side.

3. The display device according to claim 1, wherein the thin film transistor layer includes a second inorganic insulating film provided on the base substrate side of the wiring layer, and the second inorganic insulating film is provided on the base substrate side of the partition wall toward the through hole side.

4. The display device according to claim 3, wherein a sealing film in which a first inorganic sealing film, an organic sealing film, and a second inorganic sealing film are sequentially stacked, in this stated order, is provided on the light-emitting element layer, and the first inorganic sealing film is provided in the non-display area such that the first inorganic sealing film is in contact with the common second electrode, and the common second electrode is disposed on the second inorganic insulating film.

5. The display device according to claim 1, wherein the thin film transistor layer includes a second inorganic insulating film provided on the base substrate side of the wiring layer, and the second inorganic insulating film is provided on the base substrate side of the partition wall so as not to extend beyond the partition wall.

6. The display device according to claim 5, wherein the partition wall covers an edge of the second inorganic insulating film on the through hole side.

7. The display device according to claim 6, wherein the wall bottom portion covers the edge of the second inorganic insulating film on the through hole side.

8. The display device according to claim 5, wherein a sealing film in which a first inorganic sealing film, an organic sealing film, and a second inorganic sealing film are sequentially stacked, in this stated order, is provided on the light-emitting element layer, and the first inorganic sealing film is provided in the non-display area such that the first inorganic sealing film is in contact with the base substrate.

9. The display device according to claim 4, wherein a frame-shaped inner damming wall is provided in the non-display area to surround the partition wall and to overlap an inner peripheral portion of the organic sealing film.

10. The display device according to claim 4, wherein a frame area is provided around the display area, and a frame-shaped outer damming wall is provided in the frame area to surround the display area and to overlap an outer peripheral portion of the organic sealing film.

11. The display device according to claim 1, wherein the first metal layer and the third metal layer include a titanium film, and the second metal layer includes an aluminum film.

12. The display device according to claim 1, wherein the through hole contains an electronic component.

13. The display device according to claim 1, wherein each of the plurality of functional layers is an organic electroluminescence layer.

14. A display device comprising:

a base substrate;

a thin film transistor layer provided on the base substrate and including a wiring layer; and a light-emitting element layer provided on the thin film transistor layer and including a plurality of first electrodes, a plurality of functional layers, and a common second electrode, which are sequentially stacked, in this stated order, in such a manner as to correspond to a plurality of subpixels in a display area, wherein:

an insular non-display area is provided in the display area, a through hole extends in a direction of a thickness of the base substrate in the non-display area, a partition wall is provided in the non-display area such that the partition wall surrounds the through hole, the partition wall is made of a same material, and provided in a same layer, as the wiring layer, in such a manner that an edge on a through hole side of an upper side segment on a light-emitting element layer side projects toward the through hole side beyond an edge on the through hole side of a lower side segment on a base substrate side, the wiring layer includes a first metal layer, a second metal layer, and a third metal layer, all of which are sequentially stacked, in this stated order, from the base substrate side toward the light-emitting element layer side, the partition wall includes:

a wall bottom portion made of a same material, and provided in a same layer, as the first metal layer, and shaped similar to a frame, a wall middle portion made of a same material, and provided in a same layer, as the second metal layer, and shaped similar to a frame, and a wall top portion made of a same material, and provided in a same layer, as the third metal layer, and shaped similar to a frame, wherein the wall top portion comprises, on the through hole side, an edge shaped similar to an eave which projects toward the through hole side beyond an edge of the wall middle portion on the through hole side, the thin film transistor layer includes a second inorganic insulating film provided on the base substrate side of the wiring layer, the second inorganic insulating film is provided on the base substrate side of the partition wall so as not to extend beyond the partition wall, the partition wall covers an edge of the second inorganic insulating film on the through hole side, the wall bottom portion covers the edge of the second inorganic insulating film on the through hole side, and the second inorganic insulating film is provided continuously from the display area to the partition wall.

15. The display device according to claim 14, wherein a sealing film in which a first inorganic sealing film, an organic sealing film, and a second inorganic sealing film are sequentially stacked, in this stated order, is provided on the light-emitting element layer, and the first inorganic sealing film is provided in the non-display area such that the first inorganic sealing film is in contact with the base substrate.

16. The display device according to claim 14, wherein the first metal layer and the third metal layer include a titanium film, and the second metal layer includes an aluminum film.

17. The display device according to claim 14, wherein the through hole contains an electronic component.

18. A display device comprising:

a base substrate;

a thin film transistor layer provided on the base substrate and including a wiring layer; and a light-emitting element layer provided on the thin film transistor layer and including a plurality of first electrodes, a plurality of functional layers, and a common second electrode, which are sequentially stacked, in this stated order, in such a manner as to correspond to a plurality of subpixels in a display area, wherein:

an insular non-display area is provided in the display area, a through hole extends in a direction of a thickness of the base substrate in the non-display area, a partition wall is provided in the non-display area such that the partition wall surrounds the through hole, and the partition wall is made of a same material, and provided in a same layer, as the wiring layer, the wiring layer includes a first metal layer, a second metal layer, and a third metal layer, all of which are sequentially stacked, in this stated order, from a base substrate side toward a light-emitting element layer side, and the partition wall includes:

a wall bottom portion made of a same material, and provided in a same layer, as the first metal layer, and shaped similar to a frame, a wall middle portion made of a same material, and provided in a same layer, as the second metal layer, and shaped similar to a frame, and a wall top portion made of a same material, and provided in a same layer, as the third metal layer, and shaped similar to a frame, wherein the wall top portion comprises, on a through hole side, an edge shaped similar to an eave which projects toward the through hole side beyond an edge of the wall middle portion on the through hole side, without reaching an edge of the wall bottom portion on the through hole side.

* * * * *